United States Patent [19]
Kubo

[11] Patent Number: 6,132,292
[45] Date of Patent: Oct. 17, 2000

[54] CHEMICAL MECHANICAL POLISHING METHOD SUITABLE FOR HIGHLY ACCURATE PLANARIZATION

[75] Inventor: Akira Kubo, Tokyo, Japan

[73] Assignee: NEC Corporation, Tokyo, Japan

[21] Appl. No.: 09/161,218

[22] Filed: Sep. 28, 1998

[30] Foreign Application Priority Data

Sep. 30, 1997 [JP] Japan ..................... 9-265580

[51] Int. Cl.$^7$ ........................................ B24B 1/00
[52] U.S. Cl. ................... 451/36; 451/41; 451/59; 216/88; 438/692
[58] Field of Search ................... 451/36, 41, 59, 451/533, 534, 550; 216/88, 89; 438/692, 693

[56] References Cited

U.S. PATENT DOCUMENTS 5,899,792  5/1999  Yagi .
5,916,016  6/1999  Bothra .
5,924,916  6/1999  Yamashita .
5,976,000  11/1999 Hudson .

FOREIGN PATENT DOCUMENTS 8-83780    3/1996  Japan .
9-225827   9/1997  Japan .
10-249711  9/1998  Japan .

Primary Examiner—Timothy V. Eley
Assistant Examiner—Willie Berry, Jr.
Attorney, Agent, or Firm—Young & Thompson

[57] ABSTRACT

A method of forming interconnection layers within grooves of an insulating layer. The method includes the steps of: forming grooves in an upper portion of an insulating layer; depositing a conductive layer over a surface of the insulating layer and also within the grooves; and subjecting the conductive layer to a chemical mechanical polishing for polishing the conductive layer, so as to leave the conductive layer only within the grooves, thereby forming interconnection layers in the grooves. The chemical mechanical polishing is carried out by use of a polishing pad having a polyurethane foam polishing pad surface at a down pressure of no more than 420 gwt/cm$^2$.

29 Claims, 7 Drawing Sheets

CHEMICAL MECHANICAL POLISHING METHOD SUITABLE FOR HIGHLY ACCURATE PLANARIZATION

BACKGROUND OF THE INVENTION

The present invention relates to a method of forming a semiconductor device, and more particularly to a chemical mechanical polishing method of polishing a metal layer to form interconnections in grooves formed in an insulating film over a silicon substrate, which is suitable for obtaining a highly accurate planarization.

As the requirement for further scaling down of advanced semiconductor devices has been on the increase, the importance of forming interconnections as fine as possible has also been on the increase. In order to form the fine interconnections, fine grooves as interconnection patterns are formed in an insulating film such as an inter-layer insulator for subsequent deposition of a metal layer such as an aluminum layer over an entire surface of the insulating film so that the fine grooves formed in the insulating film are filled with the metal layer before a chemical mechanical polishing of the metal layer is carried out to leave the metal layer only within the fine grooves, whereby the metal layers remaining within the fine grooves serve as metal interconnections.

In Japanese laid-open patent publication No. 6-313164, there is disclosed a conventional chemical mechanical polishing method for polishing a metal layer overlying an insulating film surface having fine grooves so as to form fine metal interconnections within the fine grooves in the insulating film. FIG. 1A is a fragmentary cross sectional elevation view illustrative of a metal layer overlying a surface having fine grooves of an inter-layer insulator over a silicon substrate in a first step in sequential processes involved in a conventional chemical mechanical polishing method. FIG. 1B is a fragmentary cross sectional elevation view illustrative of a metal layer overlying a surface having fine grooves of an inter-layer insulator over a silicon substrate in a second step in the sequential processes involved in the conventional chemical mechanical polishing method.

With reference to FIG. 1A, an inter-layer insulator 22 having a thickness of about 1 micrometer is formed over a silicon substrate 21 by a thermal oxidation of silicon method or a chemical vapor deposition method. Grooves 23 serving as interconnection patterns are then formed in a surface of the inter-layer insulator 22. A metal layer 24 is deposited by a sputtering method onto an entire surface having the grooves 23 of the inter-layer insulator 22 so that the grooves 23 are completely filled with the metal layer 24 and also the metal layer 24 overlies the surface of the inter-layer insulator 22.

With reference to FIG. 1B, a surface of the metal layer 24 is subjected to a chemical mechanical polishing, wherein this chemical mechanical polishing method is carried out by use of a polishing material which has been prepared as follows. A colloidal silica slurry is diluted with a pure water to form an aqueous slurry before this aqueous slurry is then added with a polishing promoter which consists of both hydrogen peroxide and either sodium persulfate or potassium persulfate, thereby preparing the polishing material to be used for the chemical mechanical polishing. A non-woven fabric polish pad is also used as a polish pad. The metal layer 24 is polished to remain only within the grooves 23, whereby interconnection layers 26, 26a and 26b are formed within the grooves 23.

The above chemical mechanical polishing method is advantageous in being highly efficient without generation of surface defects such as scratch, but is disadvantageous in over-polishing of the metal layer 24 to form an over-polished portion 25 on a region having a high density of the interconnection layers 26, for example, a center region of the semiconductor chip, whilst peripheral regions having a low density of the interconnection layers 26a and 26b are free of the over-polished portion 25.

Namely, the polishing rate or the polishing efficiency of the above conventional chemical mechanical polishing method is likely to be higher on the high density region having the high density of the interconnections 26 than on the low density region having the low density of the interconnections 26a 26b, for which reason, on the high density region of when the high density of the interconnections 26, over-polishing is likely to appear, whereby upper portions of the interconnection layers 26 within the grooves 23 on the high density region having the high density of the interconnections 26 are also likely to be over-polished, resulting in formation of the over-polished portion 25 on the high density region having when the high density of the interconnections 26. As a result, the interconnection layers 26 formed on the high density region are thinner than the interconnection layers 26a and 26b formed on the low density regions. Namely, the above conventional chemical mechanical polishing method causes variations in thickness of the interconnection layers in the grooves due to variation in density of when the interconnection layers over the semiconductor chip. If, further, variations in the polishing rate or polishing efficiency of the metal layer depend upon variation in density of the interconnection layers, then this means that he variations in the polishing rate or polishing efficiency of the metal layer certainly depend upon variations in width of the interconnection layers even a pitch of the interconnection layers remains constant over the semiconductor chip. Namely, variations in thickness of the interconnection layers depend upon the variation in width of the interconnection layers. If the widths of the interconnection layers are varied over the semiconductor chip, then the thickness of when the interconnection layers are also varied over the semiconductor chip.

In the above circumstances, it had been required to develop a novel method of polishing a metal layer to form interconnections in grooves formed in an insulating film over a substrate free from the above disadvantages.

SUMMARY OF THE INVENTION

Accordingly, it is an object of the present invention to provide a novel chemical mechanical polishing method for polishing a metal layer to form interconnections in grooves formed in an insulating film over a substrate free from the above problems.

It is a further object of the present invention to provide a novel chemical mechanical polishing method for polishing a metal layer to form fine interconnections in fine grooves formed in an insulating film over a substrate so as to obtain a highly accurate planarization even the substrate has a large variation in density of interconnections.

It is a still further object of the present invention to provide a novel chemical mechanical polishing method for polishing a metal layer to form fine interconnections in fine grooves formed in an insulating film over a substrate so as to obtain a highly accurate planarization even the substrate has a large variation in pitch of interconnections.

It is yet a further object of the present invention to provide a novel chemical mechanical polishing method for polishing a metal layer to form fine interconnections in fine grooves formed in an insulating film over a substrate so as to obtain a highly accurate planarization even the substrate has a large variation in width of interconnections.

It is still more object of the present invention to provide a novel chemical mechanical polishing method for polishing a metal layer to form interconnections in grooves formed in an insulating film over a substrate, without providing the insulating film with any substantive scratch.

It is yet more object of the present invention to provide a novel chemical mechanical polishing method for polishing a metal layer to form interconnections in grooves formed in an insulating film over a substrate, which is capable of having polishing rate or polishing efficiency remain constant over an entire region of the substrate even the substrate has a large variation in density of interconnections.

It is a further more object of the present invention to provide a novel chemical mechanical polishing method for polishing a metal layer to form interconnections having a highly accurate uniform thickness in grooves formed in an insulating film over a substrate.

It is still more object of the present invention to provide a novel method of forming interconnections in grooves in an insulating film over a substrate free from the above problems.

It is moreover object of the present invention to provide a novel method of forming interconnections having a highly accurate uniform thickness in grooves in an insulating film over a substrate.

It is another object of the present invention to provide a novel method of forming interconnections in grooves formed in an insulating film over a substrate free from the above problems.

It is further another object of the present invention to provide a novel method of forming interconnections having a highly accurate uniform thickness in grooves formed in an insulating film over a substrate.

The present invention provides a method of forming interconnection layers within grooves of an insulating layer. The method comprises the steps of: forming grooves in an upper portion of an insulating layer; depositing a conductive layer over a surface of the insulating layer and also within the grooves; and subjecting the conductive layer to a chemical mechanical polishing for polishing the conductive layer, so as to leave the conductive layer only within the grooves, thereby forming interconnection layers in the grooves, wherein the chemical mechanical polishing is carried out by use of a polishing pad having a polishing pad surface which comprises a polyurethane foam.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENT

Figure 1A:
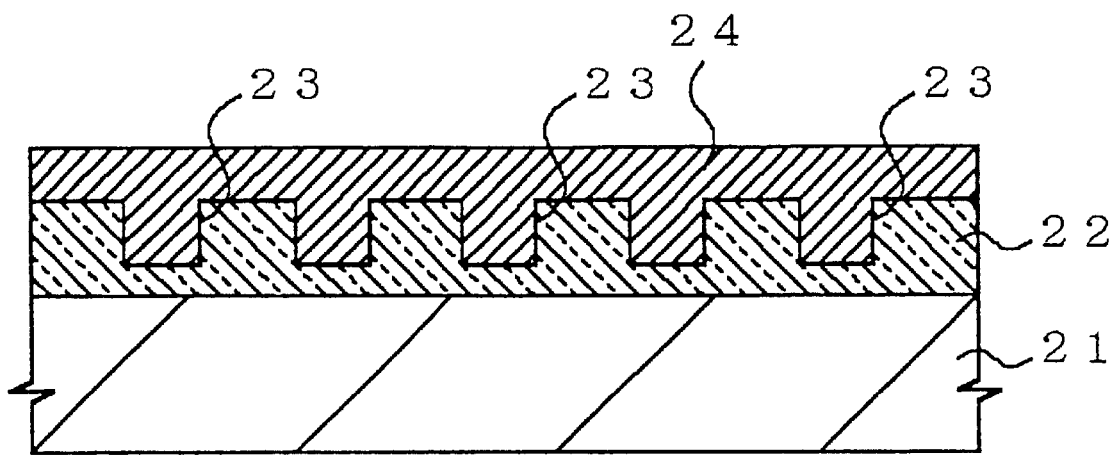
FIG. 1A is a fragmentary cross sectional elevation view illustrative of a metal layer overlying a surface having fine grooves of an inter-layer insulator over a silicon substrate in a first step in sequential processes involved in a conventional chemical mechanical polishing method.
Figure 1B:
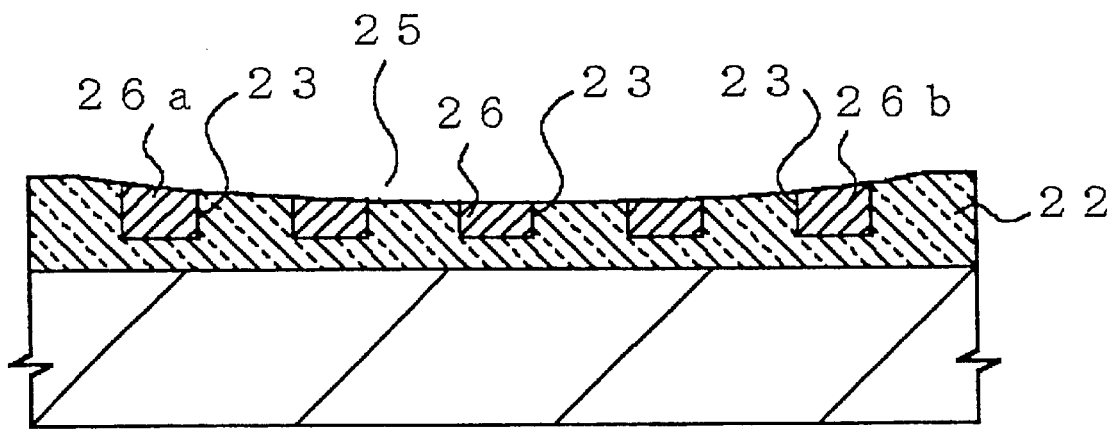
FIG. 1B is a fragmentary cross sectional elevation view illustrative of a metal layer overlying a surface having fine grooves of an inter-layer insulator over a silicon substrate in a second step in the sequential processes involved in the conventional chemical mechanical polishing method.

The first aspect of the present invention provides a chemical mechanical polishing method for polishing a surface including at least a conductive material region and at least an insulating material region, wherein the chemical mechanical polishing method is carried out by use of a polishing pad having a polishing pad surface made of polyurethane.

It is preferable that the polishing pad is used in combination with a polishing material which comprises a solution including silica particles.

It is further preferable that the silica particles included in the solution as the polishing material comprise colloidal silica particles to avoid providing the insulating region with any substantive scratch.

It is also preferable that an entire part of the polishing pad comprises a polyurethane foam in order to obtain a highly accurate planarization of the polished surface.

It is also preferable that the polishing pad comprises laminations of a non-woven fabric base layer and a polyurethane foam polishing pad surface layer covering the non-woven fabric base layer in order to obtain a highly accurate planarization of the polished surface.

It is also preferable that a down pressure of the surface onto the polishing pad is set at not higher than 420 gwt/cm$^2$ in order to obtain a highly accurate planarization of the polished surface.

In accordance with the first aspect of the present invention, the above novel chemical mechanical polishing method if capable of polishing a surface including at least a conductive material region and at least an insulating material region so as to obtain a highly accurate planarization without, however, providing the insulating region with any substantive scratch. Notwithstanding, the conductive region has a higher polishing rate or polishing efficiency than the insulating region if the conductive surface and the insulating surface were separately polished under the same down pressure and the same polishing material supply condition. Particularly, in order to obtain a highly accurate planarization without, however, providing the insulating region with any substantive scratch, it is preferable that the polyurethane polishing pad surface of the polishing pad is made into contact with the surface to be polished at a down pressure of not higher than 420 gwt/cm$^2$ with supplying a polishing material including colloidal silica particles, whereby an actual polishing rate or an actual polishing efficiency remain constant over an entire region of the surface even the surface has a large variation in density of distributed conductive regions. The polyurethane polishing pad surface has a sufficient hardness for permitting an actual polishing rate or an actual polishing efficiency to be constant over the entire region of the surface even the surface has a large variation in density of distributed conductive regions. The sufficiently hard polyurethane polishing pad surface prevents that the polishing of the conductive region having the higher polishing rate or polishing efficiency exceeds the polishing of the insulating layer. This prevents that the conductive region being on the polishing has a substantially lower level than the insulating region being on the polishing. This further prevents that the sufficiently hard polyurethane polishing pad surface is made into contact with only the insulating region. This furthermore prevents that the down pressure applied by the sufficiently hard polyurethane polishing pad surface is concentrated onto the insulating region. This means that the sufficiently hard polyurethane polishing pad surface is made into contact with both the conductive region and the insulating region with application of the substantially uniform down pressure of both the conductive region and the insulating region onto the polishing pad surface, so as to avoid any substantive local or partial over-polishing of the region on which the conductive regions exist concentratively.

Consequently, the above low down pressure of the surface to be polished onto the polishing pad surface also permits an actual polishing rate or an actual polishing efficiency to be constant over the entire region of the surface even the surface ha a large variation in density of distributed conductive regions. Namely, a highly accurate planarization of the polished surface can be obtained even the surface has a large variation in distribution or density of distributed conductive regions over the entire surface. As a result, the surface as polished by the above novel chemical mechanical polishing method is free of any substantive over-polishing region contrary to the prior art described above. If the distributed conductive regions comprise interconnections in grooves or comprise plugs filled within via holes or contact holes, then the above novel chemical mechanical polishing method is capable obtaining the highly accurate planarization even the surface has a large variation in pitch of the interconnections or the via holes or the contact, or even the surface has a large variation in width of the interconnections. As a result, it is possible to form interconnections having a highly accurate uniform thickness in grooves over the entire region of the surface.

By contrast to the above first aspect of the present invention, if the conventional chemical mechanical polishing method as described above is applied, the following problems are raised. Since the conductive region such as metal region has a higher polishing rate or polishing efficiency than the insulating region if the conductive surface and the insulating surface were separately polished under the same down pressure and the same polishing material supply condition. The hardness of the conventional polishing pad surface is, however, insufficient for permitting an actual polishing rate or an actual polishing efficiency to be constant over the entire region of the surface when the surface has a large variation in density of distributed conductive regions. The conventional insufficiently hard polishing pad surface causes that the polishing of the conductive region having the higher polishing rate or polishing efficiency exceeds the polishing of the insulating layer, whereby the conductive region being on the polishing has a substantially lower level than the insulating region being on the polishing. As a result, the sufficiently hard polyurethane polishing pad surface is made into contact with only the insulating region. This causes that the down pressure applied by the sufficiently hard polyurethane polishing pad surface is concentrated onto the insulating region. This means that the conventional insufficiently hard polyurethane polishing pad surface is made into contact with the surface to be polished with applications of the substantially different down pressures, so as to cause the substantive local or partial over-polishing of the region on which the conductive regions exist concentratively.

The second aspect of the present invention provides a chemical mechanical polishing method for polishing a conductive layer extending over a surface of an insulating layer and also being filled within depressions formed in the surface of the insulating layer, so as to leave the conductive layer only within the depressions, thereby forming conductive buried layers in the depressions, wherein the chemical mechanical polishing method is carried out by use of a polishing pad having a polishing pad surface made of polyurethane.

It is also preferable that the polishing pad is used in combination with a polishing material which comprises a solution including silica particles.

It is also preferable that the silica particles included in the solution as the polishing material comprise colloidal silica particles to avoid providing the insulating region with any substantive scratch.

It is also preferable that an entire part of the polishing pad comprises a polyurethane foam in order to obtain a highly accurate planarization of the polished surface.

It is also preferable that the polishing pad comprises laminations of a non-woven fabric base layer and a polyurethane foam polishing pad surface layer covering the non-woven fabric base layer in order to obtain a highly accurate planarization of the polished surface.

It is also preferable that a down pressure of the conductive layer onto the polishing pad is set at not higher than 420 gwt/cm$^2$ in order to obtain a highly accurate planarization of the polished surface.

It is also preferable that the depressions comprise grooves formed in an upper portion of the insulating layer, and the conductive buried layers form interconnection layers in the grooves.

It is also preferable that the depressions comprise grooves formed in an upper portion of the insulating layer, and the conductive buried layers form electrodes in the grooves.

It is also preferable that the depressions comprise via holes penetrating the insulating layer, and the conductive buried layers form plug layers filled within the via holes.

It is also preferable that the depressions comprise contact holes penetrating the insulating layer, and the conductive buried layers form plug layers filed within the contact holes.

It is also preferable that the conductive buried layers comprise metal layers.

It is also preferable that the conductive buried layers comprise refractory metal layers.

It is also preferable that the conductive buried layers comprise alloy layers.

It is also preferable that the conductive buried layers comprise impurity containing polysilicon layers.

In accordance with the second aspect of the present invention, the above novel chemical mechanical polishing method is capable of polishing the metal layer overlaying the insulating layer surface with the grooves, so as to obtain a highly accurate planarization without, however, providing the insulating layer with any substantive scratch. Notwithstanding, the conductive layer has a higher polishing rate or polishing efficiency than the insulating layer if the conductive layer and the insulating layer were separately polished under the same down pressure and the same polishing material supply condition. Particularly, in order to obtain a highly accurate planarization without, however, providing the insulating region with any substantive scratch, it is preferable that the polyurethane polishing pad surface of the polishing pad is made into contact with the surface to be polished at a down pressure of not higher than 420 gwt/cm$^2$ with supplying a polishing material including colloidal silica particles, whereby an actual polishing rate or an actual polishing efficiency remain constant over an entire region of the surface even the surface has a large variation in density of the conductive buried layers in the depressions. The polyurethane polishing pad surface has a sufficient hardness for permitting an actual polishing rate or an actual polishing efficiency to be constant over the entire region of the surface even the surface has a large variation in density of the conductive buried layers in the depressions. The sufficiently hard polyurethane polishing pad surface prevents that the polishing of the conductive buried layer having the higher polishing rate or polishing efficiency exceeds the polishing of the insulating layer. This prevents that the conductive layer being on the polishing has a substantially lower level than the insulating layer being on the polishing. This further prevents that the sufficiently hard polyurethane polishing pad surface is made into contact with only the insulating layer. This furthermore prevents that the down pressure applied by the sufficiently hard polyurethane polishing pad surface is concentrated onto the insulating layer. This means that the sufficiently hard polyurethane polishing pad surface is made into contact with both the conductive buried layer and the insulating layer with application of the substantially uniform down pressure of both the conductive layer and the insulating layer onto the polishing pad surface, so as to avoid any substantive local or partial over-polishing of the layer on which the conductive buried layers exist concentratively.

Consequently, the above low down pressure of the surface to be polished onto the polishing pad surface also permits an actual polishing rate or an actual polishing efficiency to be constant over the entire region of the surface to be polished even the surface has a large variation in density of the conductive buried layers. Namely, a highly accurate planarization of the polished surface can be obtained even the surface has a large variation in distribution or density of the conductive buried layers over the entire surface. As a result, the surface as polished by the above novel chemical mechanical polishing method is free of any substantive over-polishing region contrary to the prior art described above. If the conductive buried layers comprise interconnections in the grooves as the depressions, then the above novel chemical mechanical polishing method is capable obtaining the highly accurate planarization even the surface has a large variation in pitch of the interconnections, or even the surface has a large variation in width of the interconnections. As a result, it is possible to form interconnections having a highly accurate uniform thickness in grooves over the entire region of the surface.

By contrast to the above second aspect of the present invention, if the conventional chemical mechanical polishing method as described above is applied, the following problems are raised. Since the conductive layer such as metal region has a higher polishing rate or polishing efficiency than the insulating layer if the conductive buried layer and the insulating layer were separately polished under the same down pressure and the same polishing material supply condition. The hardness of the conventional polishing pad surface is, however, insufficient for permitting an actual polishing rate or an actual polishing efficiently to be constant over the entire region of the surface to be polished when the surface has a large variation in density of the conductive buried layers. The conventional insufficiently hard polishing pad surface causes that the polishing of the conductive buried layer having the higher polishing rate or polishing efficiency exceeds the polishing of the insulating layer, whereby the conductive buried layer being on the polishing has a substantially lower level than the insulating layer being on the polishing. As a result, the sufficiently hard polyurethane polishing pad surface is made into contact with only the insulating layer. This causes that the down pressure applied by the sufficiently hard polyurethane polishing pad surface is concentrated onto the insulating layer. This means that the conventional insufficiently hard polyurethane polishing pad surface is made into contact with the surface to be polished with applications of the substantially different down pressures, so as to cause the substantive local or partial over-polishing of the region on which the conductive buried layers exist concentratively.

The third aspect of the present invention provides a method of forming interconnection layers within grooves of an insulating layer. The method comprises the steps of: forming grooves in an upper portion of an insulating layer; depositing a conductive layer over a surface of the insulating layer and also within the grooves; and subjecting the conductive layer to a chemical mechanical polishing for polishing the conductive layer, so as to leave the conductive layer only within the grooves, thereby forming interconnection layers in the grooves, wherein the chemical mechanical polishing is carried out by use of a polishing pad having a polishing pad surface which comprises a polyurethane foam.

It is also preferable that the polishing pad is used in combination with a polishing material which comprises a solution including silica particles.

It is also preferable that the silica particles included in the solution as the polishing material comprise colloidal silica particles to avoid providing the insulating region with any substantive scratch.

it is also preferable that an entire part of the polishing pad comprises a polyurethane foam in order to obtain a highly accurate planarization of the polished surface.

It is also preferable that the polishing pad comprises laminations of a non-woven fabric base layer and a polyurethane foam polishing pad surface layer covering the non-woven fabric base layer in order to obtain a highly accurate planarization of the polished surface.

It is also preferable that a down pressure of the conductive layer onto the polishing pad is set at not higher than 420 gwt/cm$^2$ in order to obtain a highly accurate planarization of the polished surface.

It is also preferable that a part of each of the interconnection layers serves as an electrode.

It is also preferable that the interconnection layers comprise metal layers.

It is also preferable that the interconnection layers comprise refractory metal layers.

It is also preferable that the interconnection layers comprise alloy layers.

It is also preferable that the interconnection layers comprise impurity containing polysilicon layers.

In accordance with the third aspect of the present invention, the above novel chemical mechanical polishing method is capable of polishing the interconnection layer overlaying the insulating layer surface with the grooves, so as to obtain a highly accurate planarization with, however, providing the insulating layer with any substantive scratch. Notwithstanding, the conductive layer has a higher polishing rate or polishing efficiency than the insulating layer if the interconnection layer and the insulating layer were separately polished under the same down pressure and the same polishing material supply condition. Particularly, in order to obtain a highly accurate planarization without, however, providing the insulating layer with any substantive scratch, it is preferable that the polyurethane polishing pad surface of the polishing pad is made into contact with the surface to be polished at a down pressure of not higher than 420 gwt/cm$^2$ with supplying a polishing material including colloidal silica particles, whereby an actual polishing rate or an actual polishing efficiency remain constant over an entire region of the surface even the surface has a large variation in density of the interconnection layers in the grooves. The polyurethane polishing pad surface has a sufficient hardness for permitting an actual polishing rate or an actual polishing efficiency to be constant over the entire region of the surface even the surface has a large variation in density of the interconnection layers in the grooves. The sufficiently hard polyurethane polishing pad surface prevents that the polishing of the interconnection layer having the higher polishing rate or polishing efficiency exceeds the polishing of the insulating layer. This prevents that the interconnection layer being on the polishing has a substantially lower level than the insulating layer being on the polishing. This further prevents that the sufficiently hard polyurethane polishing pad surface is made into contact with only the insulating layer. This furthermore prevents that the down pressure applied by the sufficiently hard polyurethane polishing pad surface is concentrated onto the insulating layer. This means that the sufficiently hard polyurethane polishing pad surface is made into contact with both the conductive buried layer and the insulating layer with application of the substantially uniform down pressure of both the conductive layer and the insulating layer onto the polishing pad surface so as to avoid any substantive local or partial over-polishing of the layer on which the conductive buried layers exist concentratively.

Consequently, the above low down pressure of the surface to be polished onto the polishing pad surface also permits an actual polishing rate or an actual polishing efficiency to be constant over the entire region of the surface to be polished even the surface has a large variation in density of the interconnection layers. Namely, a highly accurate planarization of the polished surface can be obtained even the surface has a large variation in distribution or density of the interconnection layers over the entire surface. As a result, the surface as polished by the above novel chemical mechanical polishing method is free of any substantive over-polishing region contrary to the prior art described above. The above novel chemical mechanical polishing method is capable obtaining the highly accurate planarization even the surface has a large variation in pitch of the interconnections. As a result, it is possible to form interconnections having a highly accurate uniform thickness in grooves over the entire region of the surface.

By contrast to the above third aspect of the present invention, if the conventional chemical mechanical polishing method as described above is applied, the following problems are raised. Since the conductive layer such as metal region has a higher polishing rate or polishing efficiency than the insulating layer if the interconnection layer and the insulating layer were separately polished under the same down pressure and the same polishing surface is, however, insufficient for permitting an actual polishing rate or an actual polishing efficiency to be constant over the entire region of the surface to be polished when the surface has a large variation in density of the interconnection layers. The conventional insufficiently hard polishing the higher polishing rate or polishing efficiency exceeds the polishing of the insulating layer, whereby the interconnection layer being on the polishing has a substantially lower level than the insulating layer being on the polishing. As a result, the sufficiently hard polyurethane polishing pad surface is made into contact with only the insulating layer. This causes that the down pressure applied by the sufficiently hard polyurethane polishing pad surface is concentrated onto the insulating layer. This means that the conventional insufficiently hard polyurethane polishing pad surface is made into contact with the surface to be polished with applications of the substantially different down pressures, so as to cause the substantive local or partial over-polishing of the region on which the interconnection layers exist concentratively.

The fourth present aspect of the invention provides a polishing pad to be used for a chemical mechanical polishing method, wherein the polishing pad has a polishing pad surface made of polyurethane.

It is also preferable that the polishing pad is to be used in combination with a polishing material which comprises a solution including silica particles.

It is also preferable that the polishing pad is to be used in combination with a polishing material which comprises a solution including colloidal silica particles to avoid providing the insulating region with any substantive scratch.

It is also preferable that an entire part of the polishing pad comprises a polyurethane foam in order to obtain a highly accurate planarization of the polished surface.

It is also preferable that the polishing pad comprises laminations of a non-woven fabric base layer and a polyurethane foam polishing pad surface layer covering the non-woven fabric base layer in order to obtain a highly accurate planarization of the polished surface.

In accordance with the fourth aspect of the present invention, the above novel chemical mechanical polishing method is capable of polishing the metal layer overlaying the insulating layer surface with the grooves, so as to obtain a highly accurate planarization without, however, providing the insulating layer with any substantive scratch. Notwithstanding, the conducive layer has a higher polishing rate or polishing efficiency than the insulating layer if the conductive layer and the insulating layer were separately polished under the same down pressure and the same polishing material supply condition. Particularly, in order to obtain a highly accurate planarization without, however, providing the insulating region with any substantive scratch, it is preferable that the polyurethane polishing pad surface of the polishing pad is made into contact with the surface to be polished at a down pressure of not higher than 420 gwt/cm$^2$ with supplying a polishing material including colloidal silica particles, whereby an actual polishing rate or an actual polishing efficiency remain constant over an entire region of the surface even the surface has a large variation in density of the conductive buried layers in the depressions. The polyurethane polishing pad surface has a sufficient hardness for permitting an actual polishing rate or an actual polishing efficiency to be constant over the entire region of the surface even the surface has a large variation in density of the conductive buried layers in the depressions. The sufficiently hard polyurethane polishing pad surface prevents that the polishing of the conductive buried layer having the higher polishing rate or polishing efficiency exceeds the polishing of the insulating layer. This prevents that the conductive layer being on the polishing has a substantially lower level than the insulating layer being on the polishing. This further prevents that the sufficiently hard polyurethane polishing pad surface is made into contact with only the insulating layer. This furthermore prevents that the down pressure applied by the sufficiently hard polyurethane polishing pad surface is concentrated onto the insulating layer. This means that the sufficiently hard polyurethane polishing pad surface is made into contact with both the conductive buried layer and the insulating layer with application of the substantially uniform down pressure of both the conductive layer and the insulating layer onto the polishing pad surface so as to avoid any substantive local or partial over-polishing of the layer on which the conductive buried layers exist concentratively.

Consequently, the above low down pressure of the surface to be polished onto the polishing pad surface also permits an actual polishing rate or an actual polishing efficiency to be constant over the entire region of the surface to be polished even the surface has a large variation in density of the conductive buried layers. Namely, a highly accurate planarization of the polished surface can be obtained even the surface has a large variation in distribution or density of the conductive buried layers over the entire surface. As a result, the surface as polished by the above novel chemical mechanical polishing method is free of any substantive over-polishing region contrary to the prior art described above. If the conductive buried layers comprise interconnections in the grooves as the depressions then the above novel chemical mechanical polishing method is capable obtaining the highly accurate planarization even the surface has a large variation in pitch of the interconnections, or even the surface has a large variation in width of the interconnections. As a result, it is possible to form interconnections having a highly accurate uniform thickness in grooves over the entire region of the surface.

By contrast to the above fourth aspect of the present invention, if the conventional chemical mechanical polishing method as described above is applied, the following problems are raised. Since the conductive layer such as metal region has a higher polishing rate or polishing efficiency than the insulating layer if the conductive buried layer and the insulating layer were separately polished under the same down pressure and the same polishing material supply conditions. The hardness of the conventional polishing pad surface is, however, insufficient for permitting an actual polishing rate or an actual polishing efficiency to be constant over the entire region of the surface to be polished when the surface has a large variation in density of the conductive buried layers. The conventional insufficiently hard polishing pad surface causes that the polishing of the conductive buried layer having the higher polishing rate or polishing efficiency exceeds the polishing of the insulating layer, whereby the conductive buried layer being on the polishing has a substantially lower level that the insulating layer being on the polishing. As a result, the sufficiently hard polyurethane polishing pad surface is made into contact with only the insulating layer. This causes that the down pressure applied by the sufficiently hard polyurethane polishing pad surface is concentrated onto the insulating layer. This means that the conventional insufficiently hard polyurethane polishing pad surface is made into contact with the surface to be polished with applications of the substantially different down pressures, so as to cause the substantive local or partial over-polishing of the region on which the conductive buried layers exist concentratively.

Figure 2:
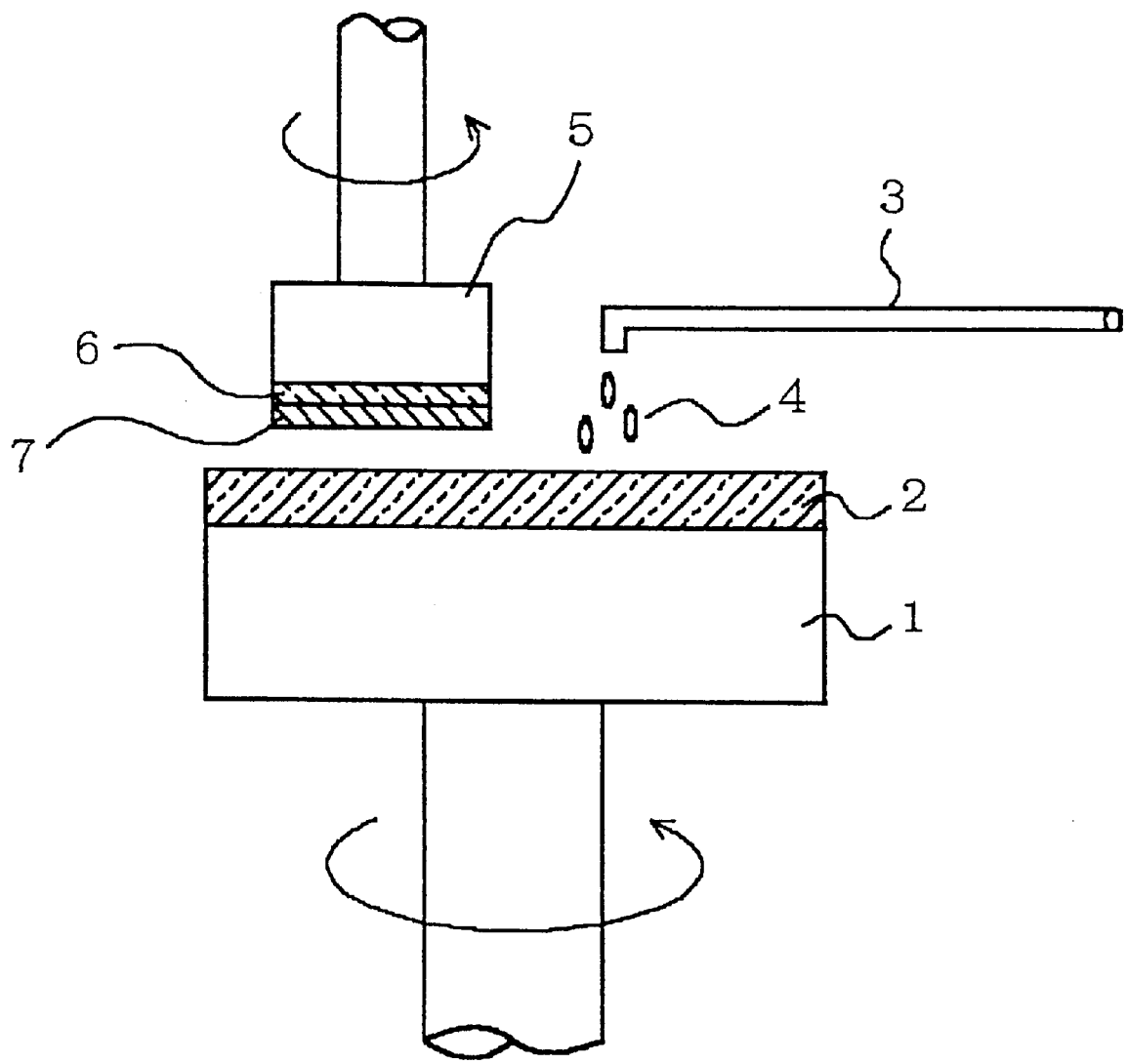
FIG. 2 is a schematic view illustrative of a chemical mechanical polishing system to be used for a novel chemical mechanical polishing method in accordance with the present invention.

A first embodiment according to the present invention will be described in detail with reference to FIG. 2 which is a schematic view illustrative of a chemical mechanical polishing system to be used for a novel chemical mechanical polishing method in accordance with the present invention. A novel polishing pad 2 is attached on a surface of a stage 1. The novel polishing pad 2 comprises a polyurethane foam. Alternatively, the polishing pad 2 comprises laminations of a soft non-woven fabric polishing pad base layer and a polyurethane foam surface layer. The polyurethane foam may preferably be of a hard type. A polishing material 4 is fed through a supply pipe 3 onto the surface of the polishing pad 2. The polishing material 4 comprises a solution containing colloidal silica particles.

A reverse face pad 6 is attached onto a surface of a wafer carrier 5. A semiconductor wafer 7 is attached onto the reverse face pad 6, so that the semiconductor wafer 7 is fixed through the reverse face pad 6 onto the wafer carrier 5. The wafer carrier 5 is connected to a rotary shaft so that the wafer carrier 5 rotates.

In a polishing process, the semiconductor wafer 7 is made into contact with the polyurethane foam polishing pad surface of the polishing pad 2 at a predetermined down pressure. The polishing material 4 is supplied onto the polyurethane foam polishing pad surface of the polishing pad 2. The stage 1 with the polishing pad 2 and the wafer carrier 5 are rotated at individually predetermined rotation rates to polish the surface of the wafer with the polyurethane foam polishing pad surface of the polishing pad 2 coated by the colloidal silica particle containing polishing material 4.

FIGS. 3A through 3D are fragmentary cross sectional elevation views illustrative of silicon substrates in sequential processes involved in a novel method of forming interconnection layers in grooves formed in an upper portion of an inter-layer insulator overlaying a silicon substrate by use of a novel chemical mechanical polishing method in accordance with the present invention.

Figure 3A:
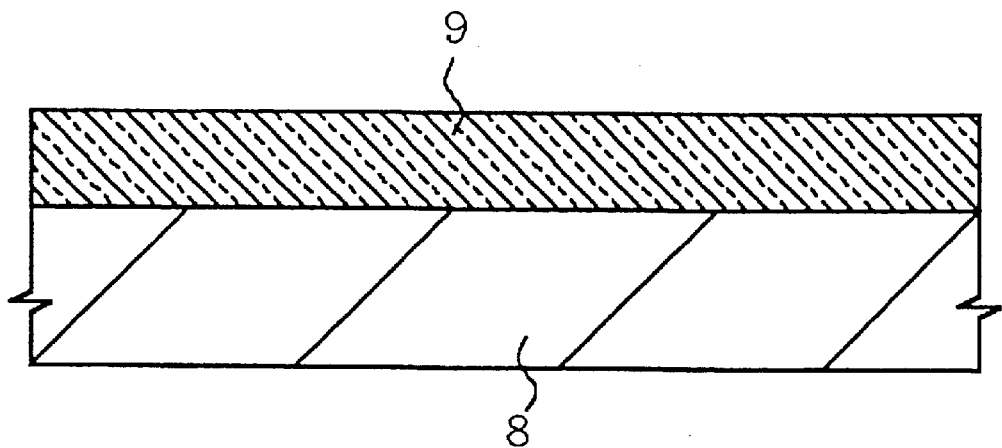
FIGS. 3A through 3D are fragmentary cross sectional elevation views illustrative of silicon substrates in sequential processes involved in a novel method of forming interconnection layers in grooves formed in an upper portion of an inter-layer insulator overlaying a silicon substrate by use of a novel chemical mechanical polishing method in accordance with the present invention.

With reference to FIG. 3A, an inter-layer insulating 9 having a thickness of about 1 micrometer is formed over a silicon substrate 8 by a thermal oxidation of silicon method and subsequent chemical vapor deposition of silicon oxide.

Figure 3B:
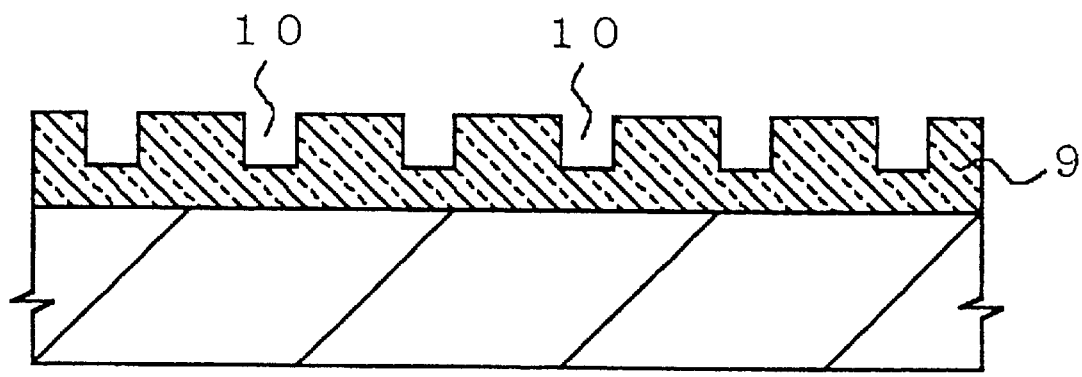

With reference to FIG. 3B, grooves 10 serving as interconnection patterns are then formed by a reactive ion etching method in a upper portion of the inter-layer insulator 9.

Figure 3C:
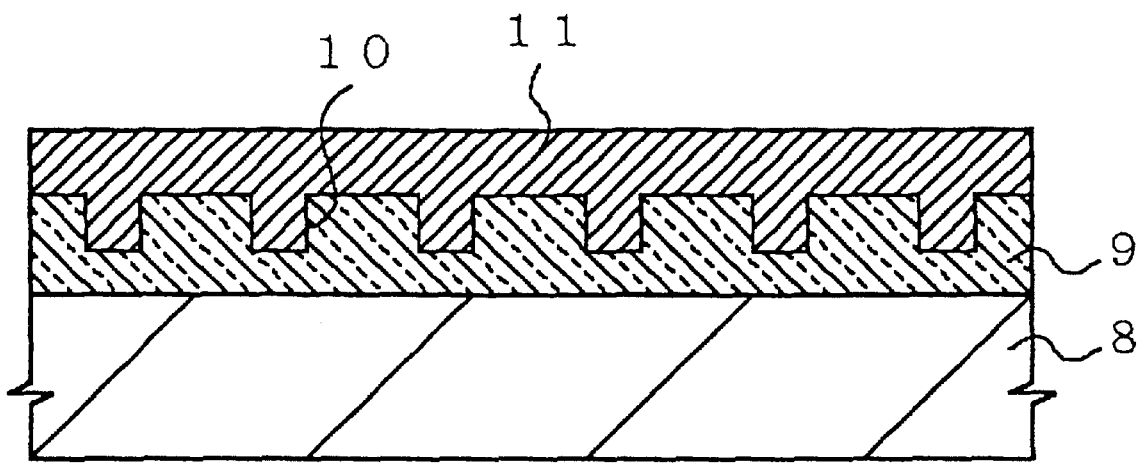

With reference to FIG. 3C, a metal layer 11 made of an aluminum-copper alloy is deposited by a sputtering method at a high temperature onto an entire surface having the grooves 10 of the inter-layer insulator 9, so that the grooves 10 are completely filled with the metal layer 11 and also the metal layer 11 overlies the surface of the inter-layer insulator 9.

Figure 3D:
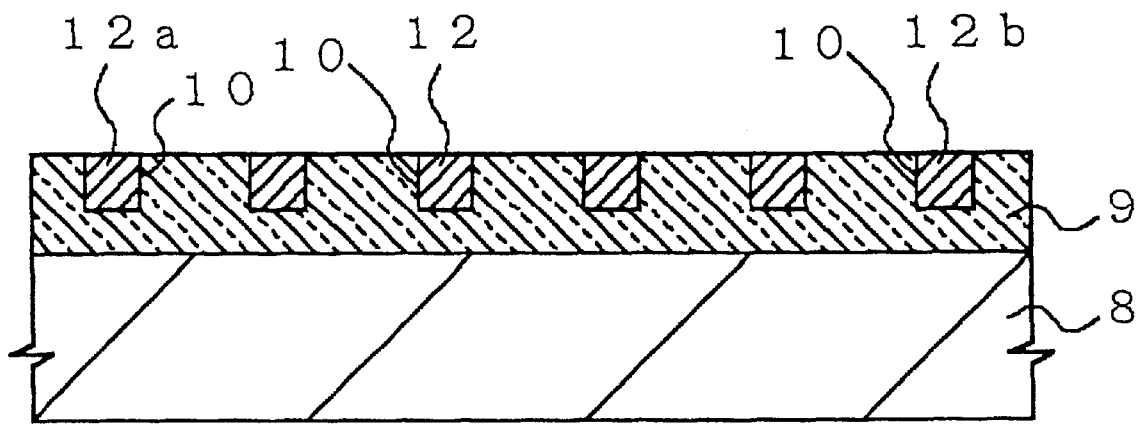

With reference to FIG. 3D, a surface of the metal layer 11 is subjected to the above described novel chemical mechanical polishing, whereby this novel chemical mechanical polishing method is carried out at a predetermined down pressure of not higher than 420 gwt/cm$^2$ by use of the polyurethane foam polishing pad and a colloidal silica slurry having a colloidal silica particle diameter of not larger than 50 nanometers. A non-woven fabric polish pad is also used as a polish pad. The metal layer 11 is polished to remain only within the grooves 10, whereby interconnection layers 12, 12a and 12b are formed within the grooves 10.

Figure 4:
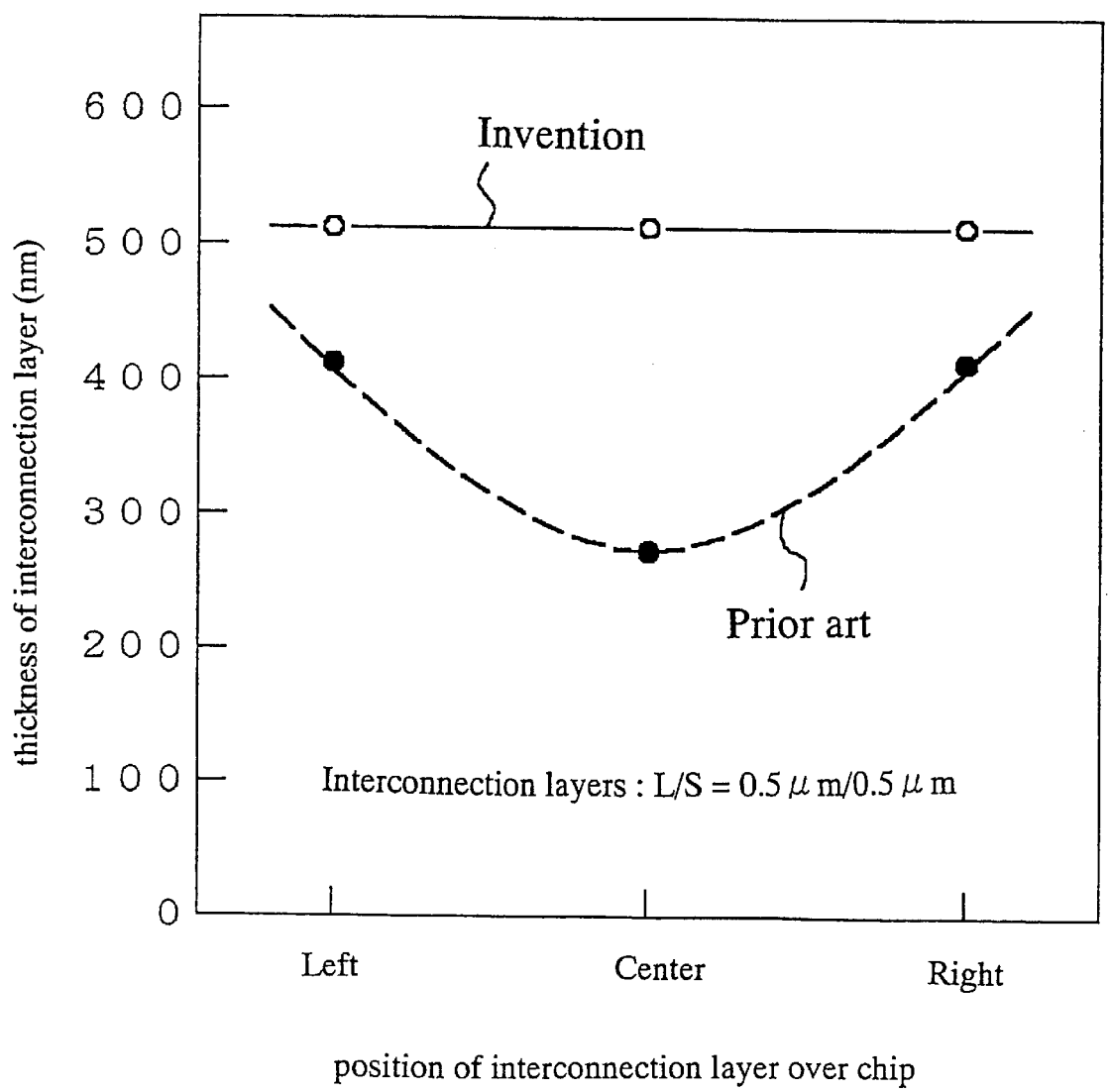
FIG. 4 is a diagram illustrative of variations in thickness of interconnection layers in grooves formed in an upper portion of an inter-layer insulator overlaying a silicon substrate versus positions of the interconnection layers both when the conventional chemical mechanical polishing method is applied and when the novel chemical mechanical polishing method in accordance with the present invention is applied.

FIG. 4 is a diagram illustrative of variations in thickness of the interconnection layers 12, 12a and 12b in the grooves 10 formed in the upper portion of the inter-layer insulator 9 overlaying the silicon substrate 8 versus positions of the interconnection layers 12, 12a and 12b both when the conventional chemical mechanical polishing method is applied and when the novel chemical mechanical polishing method in accordance with the present invention is applied. The individual interconnection layers 12, 12a and 12b have a uniform width of 0.5 micrometers. The individual interconnection layers 12, 12a and 12b are aligned at a constant line space or distance of 0.5 micrometers. A real line represents the variations in thickness of the interconnection layers 12, 12a and 12b over position when the novel chemical mechanical polishing method in accordance with the present invention is applied. A broken line represents the variations in thickness of the interconnection layers 12, 12a and 12b over position when the conventional chemical mechanical polishing method is applied.

When the conventional chemical mechanical polishing method is applied, the thickness of the interconnection layer 12 positioned at a center of the chip is 280 nanometers, whilst the thicknesses of the interconnection layers 12a and 12b positioned in peripheral regions of the chip are about 400 nanometers. There is such a large variation in the thickness of the interconnection layers 12, 12a and 12b over positions of the chip.

By contrast, when the novel chemical mechanical polishing method in accordance with the present invention is applied, the thicknesses of the interconnection layer 12 remains unchanged at about 510 nanometers over the position of the chip. There is no substantial variation in thickness of the interconnection layers 12, 12a and 12b over positions of the chip.

Figure 5:
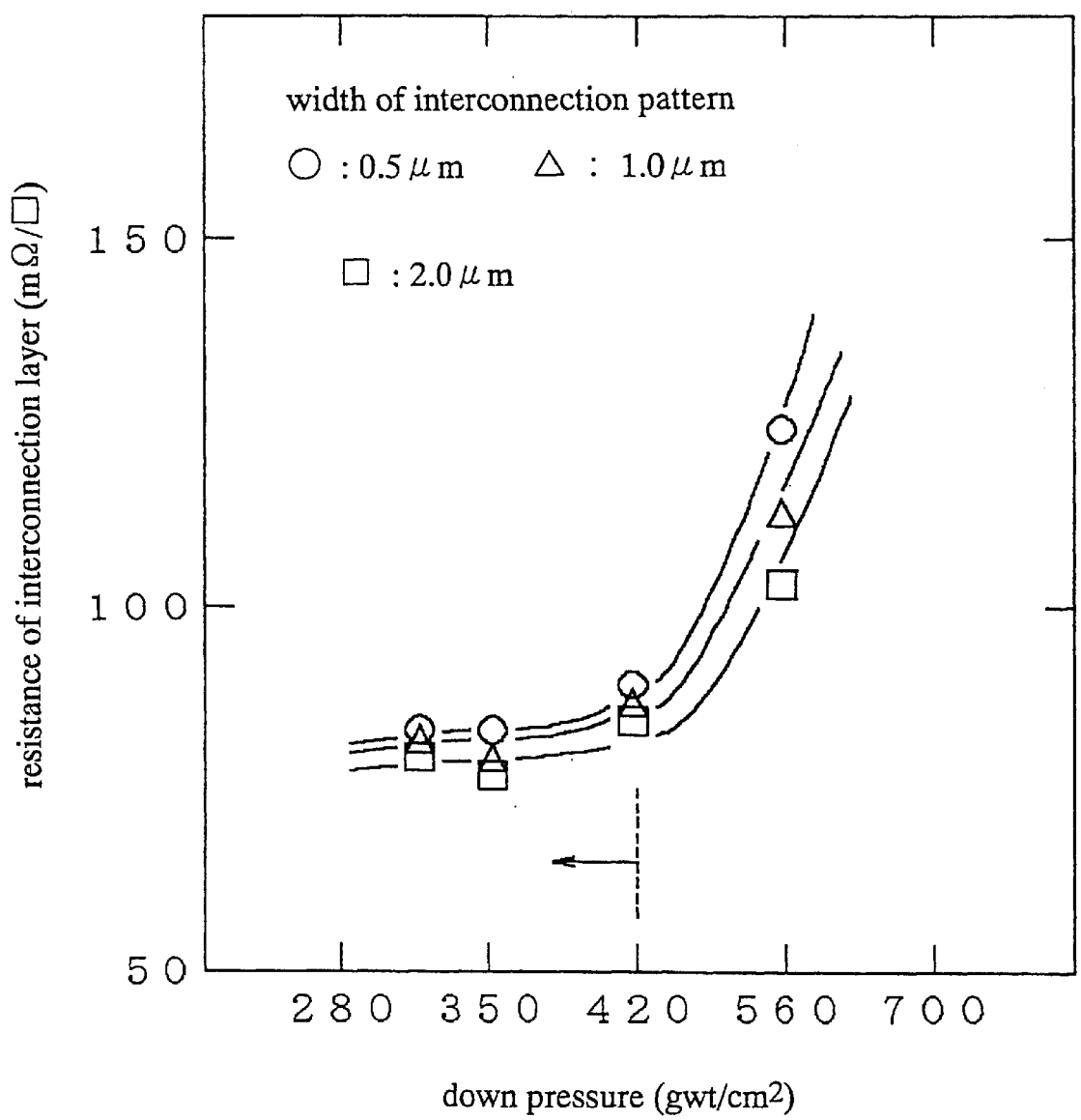
FIG. 5 is a diagram illustrative of variations in resistance of interconnection layers in grooves formed in an upper portion of an inter-layer insulator overlaying a silicon substrate versus down pressure of the substrate surface to be polished onto the novel polyurethane foam polishing pad surface of the present invention under conditions of various widths of the interconnection layers.

FIG. 5 is a diagram illustrative of variations in resistance of interconnection layers in grooves formed in an upper portion of an inter-layer insulator overlaying a silicon substrate versus down pressure of the substrate surface to be polished onto the novel polyurethane foam polishing pad surface of the present invention under conditions of various widths of the interconnection layers. Measurements of resistances were made to three different interconnection layers having different widths, for example, 0.5 micrometers, 1 micrometer and 2 micrometers, which have been formed by use of the above novel chemical mechanical polishing method. Those three different interconnection layers have a constant ratio of width to line space or distance. The first interconnection layers have a uniform width of 0.5 micrometers and are aligned at a constant line space or distance of 0.5 micrometers. The second interconnection layers have a uniform width of 1 micrometer and are aligned at a constant line space or distance of 1 micrometer. The third interconnection layers have a uniform width of 2 micrometers and are aligned at a constant line space or distance of 2 micrometers. ○ represents the measured variations in resistance of the first interconnection layers having the uniform width of 0.5 micrometers and being aligned at the constant line space or distance of 0.5 micrometers versus down pressure of the substrate surface onto the novel polyurethane foam polishing pad surface of the present invention. Δ represents the measured variations in resistance of the second interconnection layers having the uniform width of 1 micrometer and being aligned at the constant lien space or distance of 1 micrometer versus down pressure of the substrate surface onto the novel polyurethane foam polishing pad surface of the present invention. □ represents the measured variations in resistance of the first interconnection layers having the uniform width of 2 micrometers and being aligned at the constant line space or distance of 2 micrometers versus down pressure of the substrate surface onto the novel polyurethane foam polishing pad surface of the present invention. If the down pressure of the substrate surface onto the novel polyurethane foam polishing pad surface is increased to 420 gwt/cm$^2$, the resistance of the first interconnection layers is slightly or gradually increased. If the down pressure of the substrate surface onto the novel polyurethane foam polishing pad surface is increased from 420 gwt/cm$^2$ to 560 gwt/cm$^2$, the resistance of the first interconnection layers is largely and rapidly increased. Namely, if the down pressure of the substrate surface onto the novel polyurethane foam polishing pad surface is not higher than 420 gwt/cm$^2$, the resistance of the first interconnection layers substantially remains unchanged at low level. If the down pressure of the substrate surface onto the novel polyurethane foam polishing pad surface is higher than 420 gwt/cm$^2$, the resistance of the first interconnection layers is largely varied. Similarly, if the down pressure of the substrate surface onto the novel polyurethane foam polishing pad surface is increased to 420 gwt/cm$^2$, the resistance of the second interconnection layers is slightly or gradually increased. If the down pressure of the substrate surface onto the novel polyurethane foam polishing pad surface is increased from 420 gwt/cm$^2$ to 560 gwt/cm$^2$, the resistance of the second interconnection layers is largely and rapidly increased. Namely, if the down pressure of the substrate surface onto the novel polyurethane foam polishing pad surface is not higher than 420 gwt/cm$^2$, the resistance of the second interconnection layers substantially remains unchanged at low level and a different in resistance between the first and second interconnections is small. If the down pressure of the substrate surface onto the novel polyurethane foam polishing pad surface is higher than 420 gwt/cm$^2$, the resistance of the second interconnection layers is largely varied and the difference in resistance between the first and second interconnections is large. Further, similarly, if the down pressure of the substrate surface onto the novel polyurethane foam polishing pad surface is increased to 420 gwt/cm$^2$, the resistance of the third interconnection layers is slightly or gradually increased. If the down pressure of the substrate surface onto the novel polyurethane foam polishing pad surface is increased from 420 gwt/cm$^2$ to 560 gwt/cm$^2$, the resistance of the third interconnection layers is largely and rapidly increased. Namely, if the down pressure of the substrate surface onto the novel polyurethane foam polishing pad surface is not higher than 420 gwt/cm$^2$, the resistance of the second interconnection layers substantially remains unchanged at low level and a difference in resistance between the first or second and third interconnections is small. If the down pressure of the substrate surface onto the novel polyurethane foam polishing pad surface is higher than 420 gwt/cm$^2$, the resistance of the second interconnection layers is largely varied and the difference in resistance between the first or second and third interconnections is large.

Consequently, the down pressure of 420 gwt/cm$^2$ is the common critical value against the dependency or independency of the polishing rate or efficiency upon or from the interconnection pattern density. If the above novel chemical and mechanical polishing is carried out at the down pressure of higher than 420 gwt/cm$^2$, the resistance of the interconnection layers is rapidly increased, and the differences among the first, second and third interconnection layers are large and remarkable. This means that the polishing rate or efficiency or the amount of the polished metal layer is likely to depend largely upon the interconnection pattern density if the above novel chemical and mechanical polishing is carried out at the down pressure of higher than 420 gwt/cm$^2$. By contrast, if the above novel chemical and mechanical polishing is carried out at the down pressure of not higher than 420 gwt/cm$^2$, the resistance of the interconnection layers substantially remains unchanged at low level, and the differences among the first, second and third interconnection layers are small and slight. This means that the polishing rate or efficiency or the amount of the polished metal layer is likely to be independent from the interconnection pattern density if the above novel chemical and mechanical polishing is carried out at the down pressure of not higher than 420 gwt/cm$^2$. It is preferable that the above novel chemical and mechanical polishing is carried out at the down pressure of not higher than 420 gwt/cm$^2$ particularly when the chip has a large difference or variation in density of the interconnection patterns over position of the chip.

Figure 6:
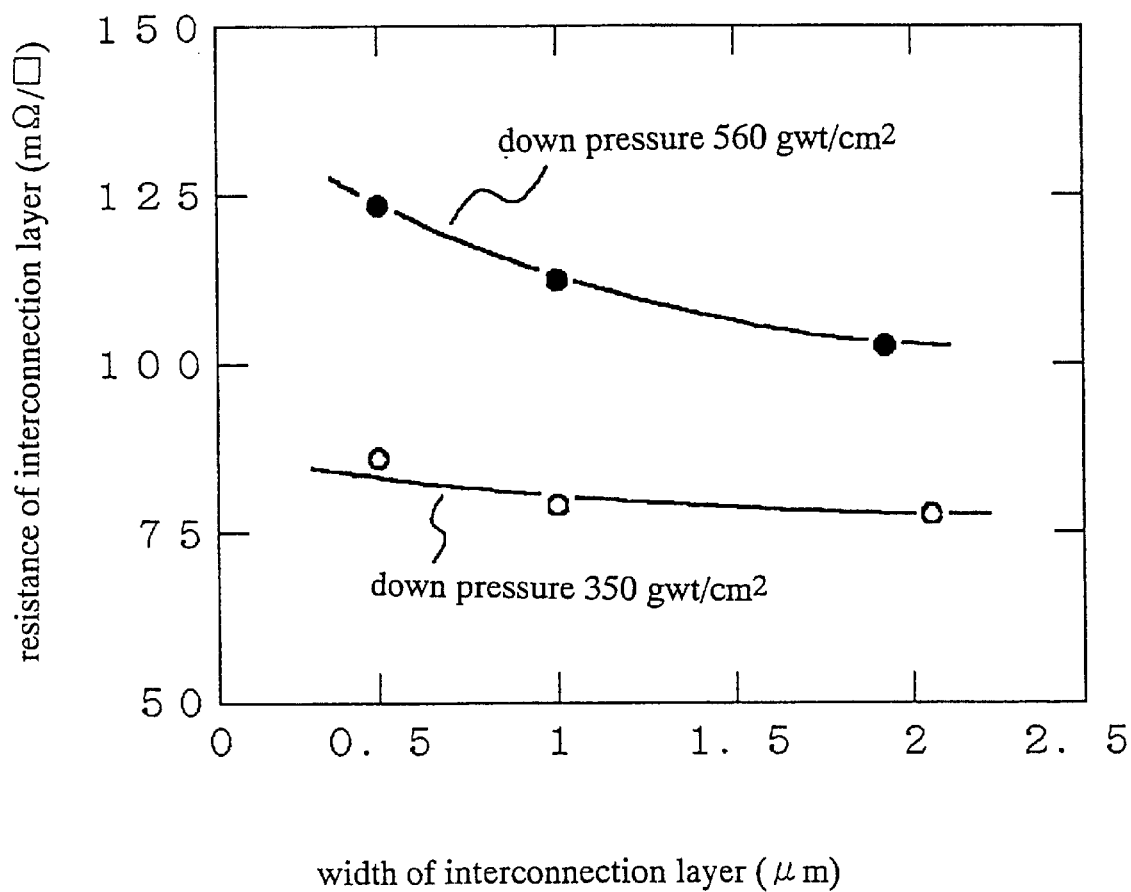
FIG. 6 is a diagram illustrative of variations in resistance of interconnection layers in grooves formed in an upper portion of an inter-layer insulator overlaying a silicon substrate versus width of the interconnection layers under conditions of various down pressures of the substrate surface to be polished onto the novel polyurethane form polishing pad surface of the present invention.

FIG. 6 is a diagram illustrative of variations in resistance of interconnection layers in grooves formed in an upper portion of an inter-layer insulator overlaying a silicon substrate versus width of the interconnection layers under conditions of various down pressures of the substrate surface to be polished onto the novel polyurethane foam polishing pad surface of the present invention. Measurements of resistances were made to three different interconnection layers having different widths, for example, 0.5 micrometers, 1 micrometer and 2 micrometers, which have been formed by use of the above novel chemical mechanical polishing method. Those three different interconnection layers have a constant ratio of width to line space or distance. The first interconnection layers have a uniform width of 0.5 micrometers and are aligned at a constant line space or distance of 0.5 micrometers. The second interconnection layers have a uniform width of 1 micrometer and are aligned at a constant lien space or distance of 1 micrometer. The third interconnection layers have a uniform width of 2 micrometers and are aligned at a constant line space or distance of 2 micrometers. ○ represents the measured variations in resistance of the first, second and third interconnection layers which have been formed by the above novel chemical mechanical polishing method carried out at a down pressure of 350 gwt/cm$^2$ of the substrate surface onto the novel polyurethane foam polishing pad surface. ● represents the measured variations in resistance of the first, second and third interconnection layers which have been formed by the above novel chemical mechanical polishing method carried out at a down pressure of 350 gwt/cm$^2$ of the substrate surface onto the novel polyurethane foam polishing pad surface. If the down pressure of the substrate surface onto the novel polyurethane foam polishing pad surface is set low at 350 gwt/cm$^2$, the resistance of the interconnection layers almost remain unchanged over the interconnection pattern widths. Namely, if the above novel chemical mechanical polishing method is carried out at the low down pressure at 350 gwt/cm$^2$, then the resistance of the interconnection layers is likely to be independent from the interconnection pattern width. If the down pressure of the substrate surface onto the novel polyurethane foam polishing pad surface is set high at 560 gwt/cm$^2$, the resistance of the interconnection layers is largely varied over the interconnection pattern widths. The resistance of the interconnection layers is increased as the interconnection pattern width is decreased. Namely, if the above novel chemical mechanical polishing method is carried out at the high down pressure at 560 gwt/cm$^2$, then the resistance of the interconnection layers is likely to be largely dependent upon the interconnection pattern width.

Consequently, the possible low down pressure is preferable for allowing the resistance of the interconnection layers to be independent from the interconnection pattern width. If the above novel chemical and mechanical polishing is carried out at the high down pressure of 560 gwt/cm$^2$, the resistance of the interconnection layers is largely varied over the interconnection pattern width, and the differences among the first, second and third interconnection layers are large and remarkable. This means that the polishing rate or efficiency or the amount of the polished metal layer is likely to depend largely upon the interconnection pattern width if the above novel chemical and mechanical polishing is carried out at the high down pressure, for example, 560 gwt/cm$^2$. By contrast, if the above novel chemical and mechanical polishing is carried out at the low down pressure of 350 gwt/cm$^2$, the resistance of the interconnection layers substantially remains unchanged at low level over the interconnection pattern width, and the differences among the first, second and third interconnection layers are small and slight. This means that the polishing rate or efficiency or the amount of the polished metal layer is likely to be independent from the interconnection pattern width if the above novel chemical and mechanical polishing is carried out at the low down pressure, for example, 350 gwt/cm$^2$. It is preferable that the above novel chemical and mechanical polishing is carried out at the down pressure as low as possible particularly when the chip has a large difference or variation in width of the interconnection patterns over positions of the chip.

In addition, the use of the polishing material including colloidal silica particles does not provide the inter-layer insulator 9 with any substantive scratch.

In accordance with the above present invention, the novel chemical mechanical polishing method is capable of polishing the metal layer overlaying the inter-layer insulator surface with the grooves, so as to obtain a highly accurate planarization without, however, providing the inter-layer insulator with any substantive scratch. Particularly, in order to obtain a highly accurate planarization without, however, providing the inter-layer insulator with any substantive scratch, it is preferable that the polyurethane foam polishing pad surface of the polishing pad is made into contact with the surface to be polished at a down pressure of not higher than the above critical down pressure of 420 gwt/cm$^2$ with supplying the polishing material including colloidal silica particles, whereby an actual polishing rate or an actual polishing efficiency remain constant over the entire region of the surface even the surface has a large variation in density of the interconnection layers over positions of the chip. The polyurethane polishing pad surface has a sufficient hardness for permitting an actual polishing rate or an actual polishing efficiency to be constant over the entire region of the surface even the surface has a large variation in density of the interconnection layers in the grooves. The sufficiently hard polyurethane polishing pad surface prevents that the polishing of the interconnection layer having the higher polishing rate or polishing efficiency exceeds the polishing of the inter-layer insulator. This prevents that the interconnection layer being on the polishing has a substantially lower level than the inter-layer insulator being on the polishing. This further prevents that the sufficiently hard polyurethane polishing pad surface is made into contact with only the inter-layer insulator. This furthermore prevents that the down pressure applied by the sufficiently hard polyurethane polishing pad surface is concentrated onto the inter-layer insulator. This means that the sufficiently hard polyurethane polishing pad surface is made into contact with both the conductive buried layer and the inter-layer insulator with application of the substantially uniform down pressure of both the conductive layer and the inter-layer insulator onto the polishing pad surface so as to avoid any substantive local or partial over-polishing of the layer on which the conductive buried layers exist concentratively.

Consequently, the above low down pressure of the surface to be polished onto the polishing pad surface also permits an actual polishing rate or an actual polishing efficiency to be constant over the entire region of the surface to be polished even the surface has a large variation in density of the interconnection layers. Namely, a highly accurate planarization of the polished surface can be obtained even the surface has a large variation in distribution or density of the interconnection layers over the entire surface. As a result, the surface as polished by the above novel chemical mechanical polishing method is free of any substantive over-polishing region contrary to the prior art described above. The above novel chemical mechanical polishing method is capable obtaining the highly accurate planarization even the surface has a large variation in pitch of the interconnections. As a result, it is possible to form interconnections having a highly accurate uniform thickness in grooves over the entire region of the surface.

By contrast to the above third aspect of the present invention, if the conventional chemical mechanical polishing method as described above is applied, the following problems are raised. Since the conductive layer such as metal region has a higher polishing rate or polishing efficiency than the inter-layer insulator if the interconnection layer and the inter-layer insulator were separately polished under the same down pressure and the same polishing material supply condition. The hardness of the conventional polishing pad surface is, however, insufficient for permitting an actual polishing rate or an actual polishing efficiency to be constant over the entire region of the surface to be polished when the surface has a large variation in density of the interconnection layers. The conventional insufficiently hard polishing pad surface causes that the polishing of the conductive buried layer having the higher polishing rate or polishing efficiency exceeds the polishing of the inter-layer insulator, whereby the interconnection layer being on the polishing has a substantially lower level than the inter-layer insulator being on the polishing. As a result, the sufficiently hard polyurethane polishing pad surface is made into contact with only the inter-layer insulator. This causes that the down pressure applied by the sufficiently hard polyurethane polishing pad surface is concentrated onto the inter-layer insulator. This means that the conventional insufficiently hard polyurethane polishing pad surface is made into contact with the surface to be polished with applications of the substantially different down pressures, so as to cause the substantive local or partial over-polishing of the region on which the interconnection layers exist concentratively.

The used polyurethane foam polishing pad may be subjected to a dressing process by use of a plate or a rod made of a diamond containing material. The dressing plate or rod of the diamond containing material is attached onto the reverse face pad 6 on the wafer carrier 5 in place of the semiconductor wafer 7 so that the dressing plate or rod is made into contact with the used polyurethane foam polishing pad at a down pressure of about 20 gwt/cm$^2$, so as to not only remove dusts from the surface of the used polyurethane foam polishing pad but also polish a surface layer of the used polyurethane foam polishing pad, whereby a new polishing surface of the polyurethane foam polishing pad is shown.

As a modification to the above first embodiment, the above novel chemical mechanical polishing method is applicable not only to the aluminum-copper alloy interconnection layers but also to other interconnection layers made of aluminum, copper, tungsten, titanium and impurity doped polysilicon.

As a further modification to the above first embodiment, the above novel chemical mechanical polishing method is applicable not only to the first level interconnection layers but also to second or third level interconnection layers.

As a furthermore modification to the above first embodiment, the above novel chemical mechanical polishing method is applicable not only to the interconnection layers but also to the metal plugs filled within the contact holes and through holes.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A chemical mechanical polishing method for polishing a first surface including at least a conductive material region and at least an insulating material region, wherein said chemical mechanical polishing method is carried out by use of a polishing pad having a polishing pad surface made of polyurethane and a down pressure of said first surface onto said polishing pad surface made of polyurethane is set at not higher than 420 gwt/cm$^2$.

2. The chemical mechanical polishing method as claimed in claim 1, wherein said polishing pad is used in combination with a polishing material which comprises a solution including silica particles.

3. The chemical mechanical polishing method as claimed in claim 2, wherein said silica particles included in said solution as said polishing material comprise colloidal silica particles.

4. The chemical mechanical polishing method as claimed in claim 1, wherein an entire part of said polishing pad comprises a polyurethane foam.

5. The chemical mechanical polishing method as claimed in claim 1, wherein said polishing pad comprises laminations of a non-woven fabric base layer and a polyurethane foam polishing pad surface layer covering said non-woven fabric base layer.

6. A chemical mechanical polishing method for polishing a conductive layer extending over a surface of an insulating layer and also being filled within depressions formed in said surface of said insulating layer, so as to leave said conductive layer only within said depressions, thereby forming conductive buried layers in said depressions, wherein said chemical mechanical polishing method is carried out by use of a polishing pad having a polishing pad surface made of polyurethane and a down pressure of said conductive layer onto said polishing pad surface made of polyurethane is set at not higher than 420 gwt/cm$^2$.

7. The chemical mechanical polishing method as claimed in claim 6, wherein said polishing pad is used in combination with a polishing material which comprises a solution including silica particles.

8. The chemical mechanical polishing method as claimed in claim 6, wherein said silica particles included in said solution as said polishing material comprise colloidal silica particles.

9. The chemical mechanical polishing method as claimed in claim 6, wherein an entire part of said polishing pad comprises a polyurethane foam.

10. The chemical mechanical polishing method as claimed in claim 6, wherein said polishing pad comprises laminations of non-woven fabric base layer and a polyurethane foam polishing pad surface layer covering said non-woven fabric base layer.

11. The chemical mechanical polishing method as claimed in claim 6, wherein said depressions comprise grooves formed in an upper portion of said insulating layer, and said conductive buried layers form interconnection layers in said grooves.

12. The chemical mechanical polishing method as claimed in claim 6, wherein said depressions comprise grooves formed in an upper portion of said insulating layer, and said conductive buried layers form electrodes in said grooves.

13. The chemical mechanical polishing method as claimed in claim 6, wherein said depressions comprise via holes penetrating said insulating layer, said conductive buried layers form plug layers filled within said via holes.

14. The chemical mechanical polishing method as claimed in claim 6, wherein said depressions comprise contact holes penetrating said insulating layer, and said conductive buried layers form plug layers filled within said contact holes.

15. The chemical mechanical polishing method as claimed in claim 6, wherein said conductive buried layers comprise metal layers.

16. The chemical mechanical polishing method as claimed in claim 6, wherein said conductive buried layers comprise refractory metal layers.

17. The chemical mechanical polishing method as claimed in claim 6, wherein said conductive buried layers comprise alloy layers.

18. The chemical mechanical polishing method as claimed in claim 6, wherein said conductive buried layers comprise impurity containing polysilicon layers.

19. A method of forming interconnection layers within grooves of an insulating layer, said method comprising the steps of:

forming grooves in an upper portion of an insulating layer;

depositing a conductive layer over a surface of said insulating layer and also within said grooves; and subjecting said conductive layer to a chemical mechanical polishing for polishing said conductive layer, so as to leave said conductive layer only within said grooves, thereby forming interconnection layers in said grooves, wherein said chemical mechanical polishing is carried out by use of a polishing pad having a polishing pad surface which comprises a polyurethane foam and a down pressure of said conductive layer onto said polishing pad surface which comprises polyurethane foam is set at not higher than 420 gwt/cm$^2$.

20. The method as claimed in claim 19, wherein said polishing pad is used in combination with a polishing material which comprises a solution including silica particles.

21. The method as claimed in claim 20, wherein said silica particles included in said solution as said polishing material comprise colloidal silica particles.

22. The method as claimed in claim 19, wherein an entire part of said polishing pad comprises a polyurethane foam.

23. The method as claimed in claim 19, wherein said polishing pad comprises laminations of a non-woven fabric base layer and a polyurethane foam polishing pad surface layer covering said non-woven fabric base layer.

24. The method as claimed in claim 19, wherein a part of each of said interconnection layers serves as an electrode.

25. The method as claimed in claim 19, wherein said interconnection layers comprise metal layers.

26. The method as claimed in claim 19, wherein said interconnection layers comprise refractory metal layers.

27. The method as claimed in claim 26, wherein said interconnection layers comprise impurity containing polysilicon layers.

28. The method as claimed in claim 19, wherein said interconnection layers comprise alloy layers.

29. A chemical mechanical polishing method for polishing a surface that includes a conductive material region and an insulating material region, the method comprising the steps of:

chemical mechanical polishing the surface with a polishing pad having a polishing face made of polyurethane; and maintaining an electrical resistance of the conductive material region below a first level by setting a compressive pressure between the polishing face made of polyurethane and the surface not higher than 420 gwt/cm$^2$.

* * * * *